(12) United States Patent
Gallagher et al.

(10) Patent No.: US 7,506,236 B2
(45) Date of Patent: Mar. 17, 2009

(54) TECHNIQUES FOR OPERATING SEMICONDUCTOR DEVICES

(75) Inventors: William Joseph Gallagher, Ardsley, NY (US); Daniel Christopher Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 815 days.

(21) Appl. No.: 10/856,394

(22) Filed: May 28, 2004

(65) Prior Publication Data

US 2005/0268207 A1    Dec. 1, 2005

(51) Int. Cl.
  *G11C 29/00* (2006.01)
(52) U.S. Cl. ..................... 714/763; 714/758
(58) Field of Classification Search .............. 714/763, 714/758; 365/200, 145; 360/53
  See application file for complete search history.

(56) References Cited

U.S. PATENT DOCUMENTS

| | | | | |
|---|---|---|---|---|
| 4,216,541 A | * | 8/1980 | Clover et al. ................ | 714/764 |
| 5,121,263 A | * | 6/1992 | Kerwin et al. ................ | 360/53 |
| 5,732,092 A | * | 3/1998 | Shinohara .................... | 714/764 |
| 6,501,611 B1 | * | 12/2002 | Li .............................. | 360/67 |
| 6,535,416 B1 | * | 3/2003 | Daughton et al. ........... | 365/145 |
| 6,545,906 B1 | | 4/2003 | Savtchenko et al. | |
| 2003/0081467 A1 | * | 5/2003 | Nishimura ................... | 365/200 |
| 2005/0248999 A1 | * | 11/2005 | Tamura et al. .............. | 365/200 |
| 2005/0268207 A1 | * | 12/2005 | Gallagher et al. ........... | 714/763 |

\* cited by examiner

*Primary Examiner*—Guy J Lamarre
(74) *Attorney, Agent, or Firm*—Ryan, Mason & Lewis, LLP

(57) ABSTRACT

Techniques for data storage are provided. In one aspect, a method for writing one or more magnetic memory cells comprises the following steps. Data is written to one or more of the magnetic memory cells. It is detected whether there are any errors in the data written to the one or more magnetic memory cells. The data is rewritten to each of the one or more previously written magnetic memory cells in which an error is detected.

16 Claims, 6 Drawing Sheets

FIG. 9

TECHNIQUES FOR OPERATING SEMICONDUCTOR DEVICES

FIELD OF THE INVENTION

The present invention relates to semiconductor devices and, more particularly, to techniques for data storage in semiconductor devices.

BACKGROUND OF THE INVENTION

Certain semiconductor devices, e.g., magnetic random access memory (MRAM) devices, use magnetic memory cells to store information. Each magnetic memory cell typically comprises a submicron piece of magnetic material, e.g., having the dimensions of 300 nanometers (nm) by 600 nm in area and five nm thick.

Information is stored in such semiconductor devices as an orientation of the magnetization of a free layer in the magnetic memory cell as compared to an orientation of the magnetization of a fixed (e.g., reference) layer in the memory cell. The magnetization of the free layer may be oriented parallel or anti-parallel relative to the fixed layer, representing either a logic "1" or a "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right. The application of a magnetic field can switch the magnetization of the free layer from left to right, and vice versa, to write information to the magnetic memory cell. One of the important requirements for data storage is that the magnetization of the cell not change orientation unintentionally during the writing process or when there is a zero applied field, or only a small applied field.

Unfortunately, in practice, the magnetization of one or more magnetic memory cells may change orientation unintentionally, due, at least in part, to thermal activation. Thermal activation occurs when thermal energy from the environment surrounding a given cell overcomes an activation energy barrier so as to change the direction of magnetization of the magnetic memory cell. The occurrences of thermal activation should be minimized. The resulting error rate due to thermally activated switching is called the soft error rate (SER).

One of the objectives in designing semiconductor devices is to minimize the operating power and area consumed by the devices. These two design objectives, namely, low operating power and small area, may be achieved by devices having a low switching field to switch such devices. A low switching field uses a low switching current, which in turn uses less power. Further, lower switching currents require smaller switches, which occupy less area. Consequently, these two design objectives are consistent with one another. However, lowering switching fields often undesirably lead to an increase in the SER.

Therefore, techniques are needed for operating semiconductor devices with a low switching field, while at the same time reducing, or eliminating, the effect of soft errors.

SUMMARY OF THE INVENTION

The present invention provides techniques for data storage. In one aspect of the invention, a method for writing one or more magnetic memory cells comprises the following steps. Data is written to one or more of the magnetic memory cells. It is detected whether there are any errors in the data written to the one or more magnetic memory cells. The data is rewritten to each of the one or more previously written magnetic memory cells in which an error is detected.

A more complete understanding of the present invention, as well as further features and advantages of the present invention, will be obtained by reference to the following detailed description and drawings.

DETAILED DESCRIPTION OF THE INVENTION

Figure 1:
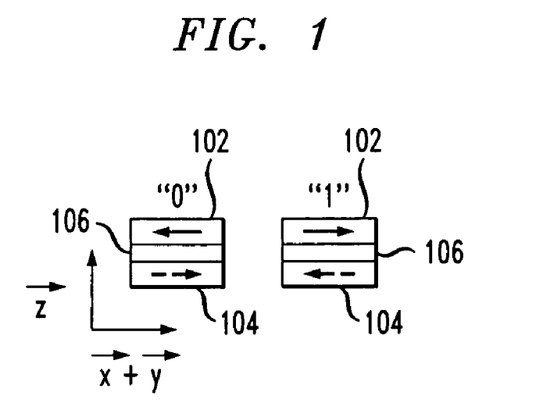
FIG. 1 is a diagram illustrating an exemplary free layer configuration of a magnetic memory cell having two anti-parallel coupled magnetic layers according to an embodiment of the present invention.

FIG. 1 is a diagram illustrating an exemplary free layer configuration of a magnetic memory cell having two anti-parallel coupled magnetic layers. Namely, in the exemplary configuration shown in FIG. 1, a free layer may comprise at least two magnetic layers, e.g., magnetic layers 102 and 104, anti-parallel coupled by spacer layer 106. Spacer layer 106 may comprise a transition metal. Suitable transition metals include, but are not limited to, chromium, copper, ruthenium, rhodium, palladium, rhenium, osmium, iridium, platinum and combinations comprising at least one of the foregoing transition metals.

A magnetic memory cell having a free layer comprising two anti-parallel coupled magnetic layers is hereinafter referred to as a "toggle magnetic memory cell." U.S. Pat. No. 6,545,906 issued to Savtchenko et al. (hereinafter "Savtchenko"), the disclosure of which is incorporated by reference herein, discloses the use of such a toggle magnetic memory cell in an MRAM device. Savtchenko describes a writing process wherein a magnetic memory cell is first read to determine its state, and then, if necessary, toggled.

As shown in FIG. 1, magnetic layers 102 and 104 have opposite directed magnetizations, as indicated by the vector arrows corresponding to each layer. As will be described in detail below, for example in conjunction with the description of FIG. 2, the directions of magnetization of magnetic layers 102 and 104 in the states shown, e.g., "0" and "1," are typically directed at approximately 45 degree angles with respect to the x- and y-coordinate axes, e.g., the bit line and word line, respectively, of the magnetic memory cell.

When the magnetic memory cell is switched, e.g., from a "0" state to a "1" state, or vice versa, the orientations of magnetic layers 102 and 104 reverse. Readout of a magnetic memory cell, e.g., reading the state of the cell as either a "0" or a "1," for example, through its resistance properties, may be accomplished by tunneling into the free layer from a fixed layer of the cell. Regarding a free layer comprising multiple layers, readout of a magnetic memory cell may be accomplished by tunneling into one of the multiple layers of the free layer, e.g., magnetic layer 102 or 104, from the fixed layer. Namely, the resistance of such a tunnel junction depends primarily on the relative orientations of magnetization of the free magnetic layer as a whole and the fixed magnetic layer.

Figure 2:
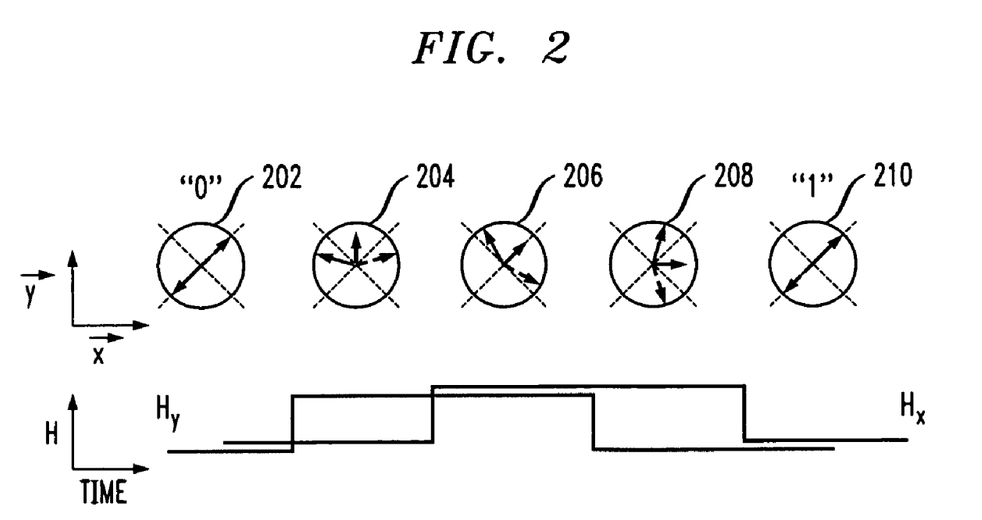
FIG. 2 is a diagram illustrating a sequence of top down views of a free layer comprising multiple magnetic layers engaged in a switching operation according to an embodiment of the present invention.

FIG. 2 is a diagram illustrating a sequence of top down views of a free layer comprising multiple magnetic layers engaged in a switching operation. For ease of illustration, the vectors representing the directions of magnetization of the two magnetic layers making up the free layer, e.g., magnetic layers 102 and 104 as in FIG. 1 above, are shown as being displaced from one another with a common origin. However, these vectors actually lie substantially one on top of the other.

As mentioned above, each of the two magnetic layers making up the free layer have natural anisotropy directions that point at approximately 45 degrees to the x- and y-axes of the magnetic memory cell (as illustrated by the vector arrows corresponding to each layer) such that the natural directions the magnetization vectors point are also generally along approximately 45 degrees to the x- and y-axes of the magnetic memory cell. This orientation is shown in view 202 of FIG. 2.

According to the exemplary technique illustrated in FIG. 2, as the magnetic memory cell is switched, the magnetic field along the y-axis of the magnetic memory cell $H_y$ is first pulsed on causing the magnetic moments of the two magnetic layers making up the free layer (oriented anti-parallel to each other) to cant. This will create a net total moment, indicated by a solid black vector arrow, for the magnetic layers making up the free layer, as is shown in view 204 of FIG. 2. Next, the magnetic field along the x-axis of the magnetic memory cell $H_x$ is also pulsed on, causing the net magnetic moment of the magnetic layers making up the free layer to rotate 45 degrees, as is shown in view 206 of FIG. 2. $H_y$ is then pulsed off and the net moment of the canted magnetic layers rotates 45 degrees further, as is shown in view 208 of FIG. 2. $H_x$ is then pulsed off and the canted magnetic layers relax back to having a direction of magnetization opposite to one another, e.g., along the 45 degree anisotropy direction, as is shown in view 210 of FIG. 2.

It is important to note, however, that the two magnetic layers making up the free layer now each have a direction of magnetization opposite to the original orientation of each layer, as can be seen from a comparison of view 210 with view 202 of FIG. 2. Therefore, the magnetic memory cell has been "toggle written" by this sequence of field pulsing.

Figure 3:
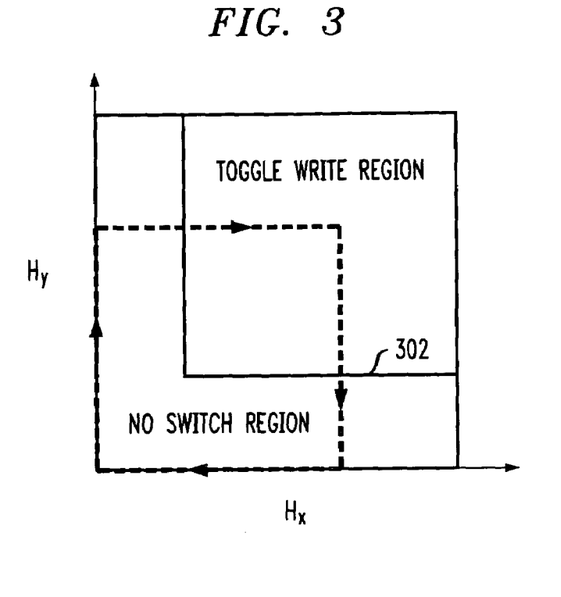
FIG. 3 is a graph illustrating a deterministic representation of the magnetic field for switching a magnetic memory cell.

FIG. 3 is a graph illustrating a deterministic representation of the magnetic field for switching a magnetic memory cell. Namely, FIG. 3 illustrates the typical operating window for a magnetic memory cell undergoing toggle writing. The sequence of field pulsing, e.g., pulsing of $H_x$ and $H_y$, that constitutes the write operation is illustrated by the dashed trajectory. This trajectory must transverse toggle write region/no switch region boundary 302 in order for the magnetic memory cell to be written.

With toggle writing, there is a probability that during the write operation, e.g., as described above in conjunction with the description of FIG. 2 above, the magnetic moments of the magnetic layers making up the free layer will spontaneously reverse, due to, for instance, normal thermally activated processes. This spontaneous reversal contributes to the soft error rate (SER). Therefore, there is some probability that after the write operation, the magnetic memory cell will end up in the wrong state. This probability may be acceptably small for large magnetic memory cells, e.g., 16 megabit memory, with high write currents, e.g., less than or equal to about 0.1 failures in ten years, but becomes unworkably large as magnetic memory cell size and write currents are reduced. The probability of errors, bit size and write currents are described, by way of example, in detail below.

According to the techniques presented herein, writing of a magnetic memory cell can be accomplished at a smaller write field and a predicted number of soft errors are accommodated by subsequently performing a checking step to detect if the magnetic memory cell was written correctly. If the magnetic memory cell was not written correctly, it is written again. Using reduced write fields, predicting soft errors and performing checking steps to detect the soft errors will be described in detail below.

A smaller write field results in a reduced activation energy barrier $E_a$ for the magnetic memory cell during the period when the write field is applied. A reduced $E_a$ can result in, for example, up to about three percent of the magnetic memory cells written ending up in the wrong magnetic state.

Activation energy may be approximated using a single domain model and assuming that the intrinsic anisotropy is small, e.g., less than about 50 Oersted (Oe), compared to the dipole fields:

$$e_a = (h^4 - 2h^2 \sin 2\alpha + 1)^{1/2}. \tag{1}$$

Figure 4:
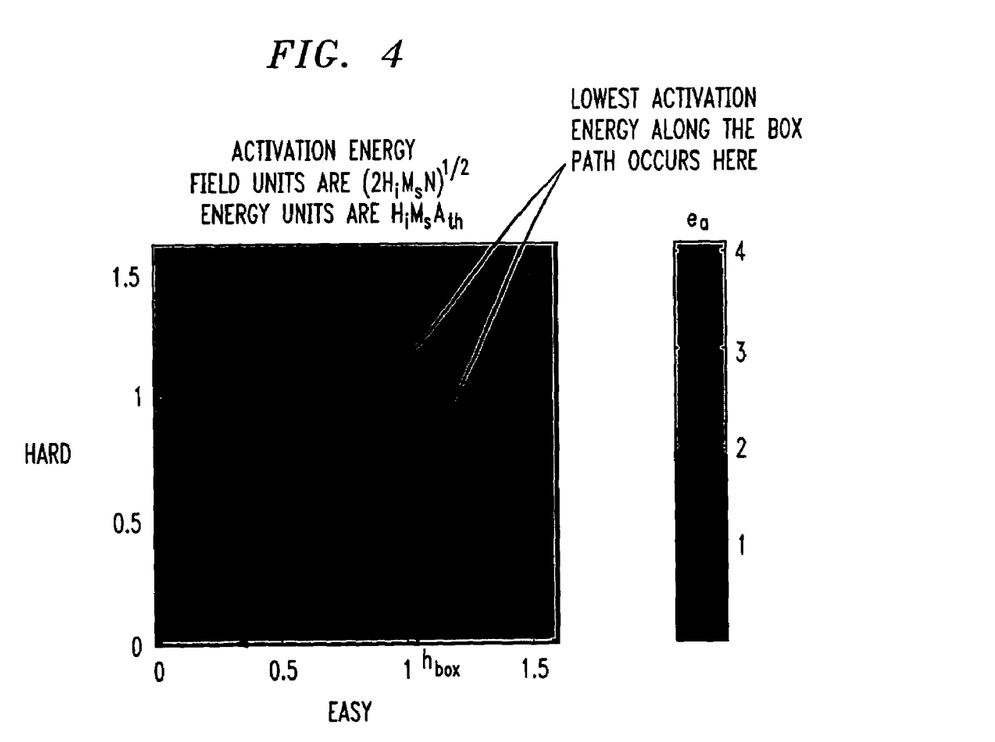
FIG. 4 is a graph illustrating the activation energy for an exemplary magnetic memory cell according to an embodiment of the present invention.

FIG. 4 is a graph illustrating the $E_a$ for an exemplary magnetic memory cell. Namely, the graph in FIG. 4 shows that $E_a$ is in fact variable along the box path, which may be contrasted with the deterministic view of $E_a$ shown, for example, in FIG. 3.

In Equation 1, above, reduced units are used, as indicated by, for example, the use of $e_a$ to represent unitless activation energy. For example, $e_a = 1$ is the activation energy in zero field and h=1 is the magnitude of the applied magnetic field equal to the spin flop field $H_{sf}$. Reduced units may be converted to field units or energy units using the formulas provided in FIG. 4. For example, regarding field units, $E_a = e_a (2H_i M_s N)^{1/2}$, and regarding energy units, $H_x = h_x (H_i M_s A t_h)$ and $H_y = h_y (H_i M_s A t_h)$, wherein A is the area of the memory cell, $t_h$ is the thickness of the memory cell, $H_i$ is the intrinsic anisotropy of the memory cell, $M_s$ is magnetization and N is the demagnetization factor. For example, $N=4\pi(t_h/b)nx$, wherein b is the width of the cell and nx is the dimensionless demagnetization factor, for example, for a circle nx=0.785. The x-axis and the y-axis of the graph shown in FIG. 4 are the magnetic fields from the bit line and the word line, respectively. $\alpha$ represents the angle from the bit line field axis. At $\alpha=\pi/4$, $E_a$ goes to zero at the spin flop point ($h_x=h_y=1/\sqrt{2}$). It is to be appreciated that the bit line and word line fields are not confined to a particular orientation.

To avoid soft errors, regions of reduced $E_a$ typically are avoided. Specifically, to make the probability of unwanted reversal of the magnetic memory cell during the write operation no greater than during the storage operation, e.g., less than about 0.1 failures over a ten year period for a given exemplary 16 megabit memory, an $e_a \geq 1$ should be maintained throughout the entire write path.

A write path for switching the magnetic memory cell, indicated by dashed lines superimposed on the $E_a$ graph of FIG. 4, reveals that when the word line field is first turned on to $h_y=h_{box}$, and the bit line field is turned on to $h_x=h_{box}$, and then the word line field is turned off, and the bit line field is turned off, the lowest $E_a$ occurs approximately at $h_x=h_{box}$ and $h_y=h_{sf}$, or at $h_x=h_{sf}$ and $h_y=h_{box}$ (as indicated by the arrows in FIG. 4). Putting these fields into Equation 1, above, provides the lowest activation energy along the write path to be approximately, $$e_a^{lowest} = ((h_{box}^2 + 1/2)^2 - 2\sqrt{2}h_{box} + 1)^{1/2} \text{ for } h_{box} > 1/\sqrt{2}. \quad (2)$$

Therefore, $h_{box}$ should be greater than or equal to about 1.14 in order to maintain an $e_a \geq 1$. However, according to the teachings presented herein, write fields may be employed that are substantially less than 1.14 (e.g., $h_{box} < 1.14$).

Figure 5:
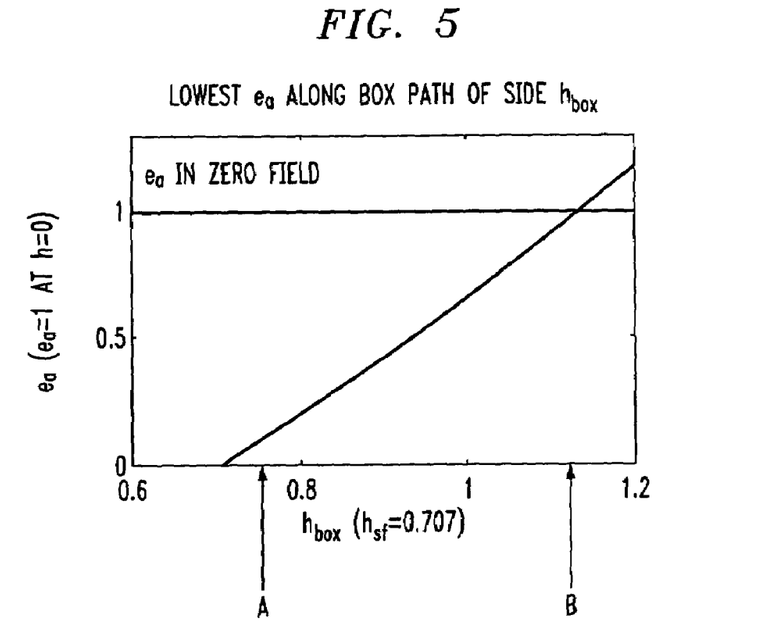
FIG. 5 is a graph illustrating $E_a$ as a function of the write field according to an embodiment of the present invention.

As can be seen from FIG. 4, employing a write field that is less than 1.14 results in $e_a < 1$ along some portion of the write path. Therefore, there will be some probability that the storage state of the magnetic memory cell will reverse, e.g., resulting in a nonzero SER. FIG. 5 is a graph illustrating $E_a$ as a function of the write field. Namely, in FIG. 5, Equation 2 is shown plotted as a function of $h_{box}$. The $E_a$ required to make the SER vanishingly small so as to be negligible, (an $e_a \geq 1$) is shown by the dashed line in FIG. 5. An $e_a \geq 1$ requires writing at a field of $h_{box} \geq 1.14$, as indicated by the arrow labeled "B." For $h_{box} < 1.14$, the activation energy decreases to zero around $h_{box} = 0.7$. According to the teachings of the present invention, a write field as small as $h_{box} \leq 0.8$ may be used, as indicated by the arrow labeled "A," which will reduce the power consumed by the magnetic memory cell.

Employing a write field of $h_{box} \leq 1.14$ yields a probability P of the magnetic memory cell ending up in the wrong state, e.g., failing, as, $$P = 1 - \exp\left[-\frac{t}{\tau}e^{-E_a/kT}\right], \quad (3)$$

wherein $\tau$ is the attempt period (which is typically about 0.5 nanoseconds), t is the length of time the bit has reduced $E_a$, k is Boltzmann's constant and T is the absolute temperature of the magnetic memory cell. t can be approximated as a fraction of the pulse length for which $E_a$ is substantially reduced, e.g., less than or equal to about 0.5 of the pulse length.

Figure 6:
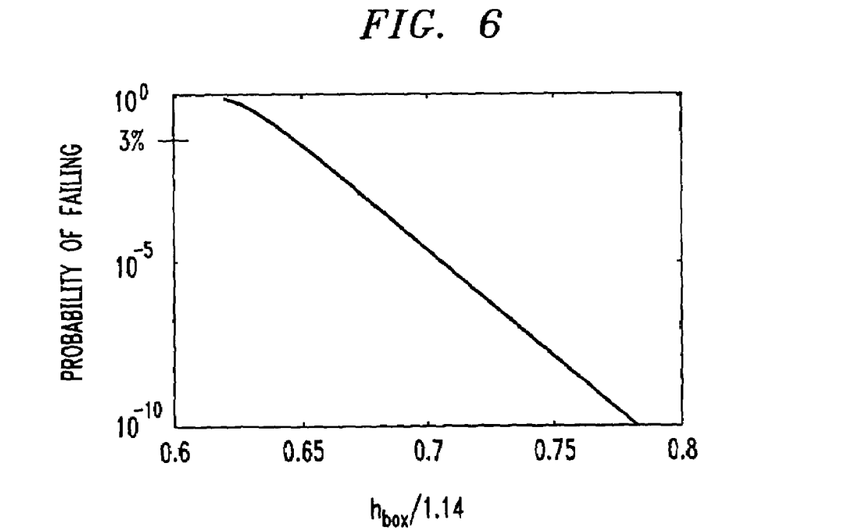
FIG. 6 is a graph illustrating the probability of soft errors as a function of the write field of a magnetic memory cell according to an embodiment of the present invention.

Combining Equations 2 and 3, above, provides a good estimate of the SER. FIG. 6 is a graph illustrating the probability of soft errors as a function of the write field of a magnetic memory cell. Namely, in FIG. 6, Equation 3 is plotted as a function of the write field, normalized by a write field of $h_{box} = 1.14$ that, as described above, maintains an $e_a \geq 1$ (i.e., the x axis being the ratio $h_{box}/1.14$). FIG. 6 shows that operating at only 65 percent of the typical write field will result in about a three percent SER. As will be described in detail below, these three percent errors are caught during a checking step wherein incorrectly written magnetic memory cells are written a second time (e.g., rewritten). Those rewritten magnetic memory cells then are checked again, and it is probable that about three percent of those rewritten magnetic memory cells will be in error (e.g., 0.09 percent of the original number of magnetic memory cells). Those three percent of incorrectly rewritten magnetic memory cells will be rewritten a third or more time. This cycle continues until all magnetic memory cells are written correctly, for example, which may entail about one in a million magnetic memory cells needing to be written five times or more, e.g., up to about ten times or more. As a result, the write current is reduced by about 35 percent, as compared to $h_{box} = 1.14$, and the write time has been increased by about five times.

Figure 7:
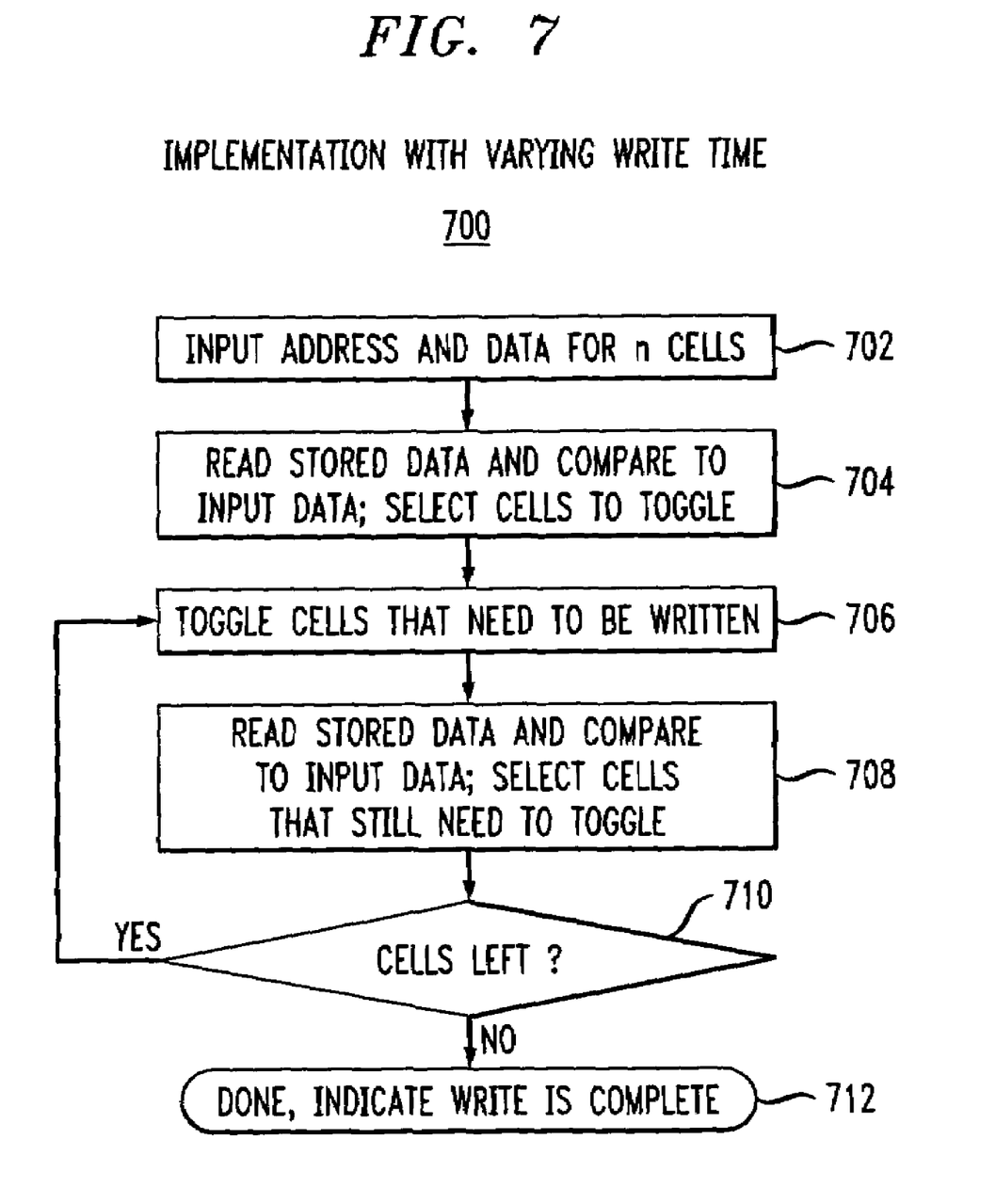
FIG. 7 is a logical flow diagram illustrating an exemplary methodology for writing one or more magnetic memory cells according to an embodiment of the present invention.

FIG. 7 is a logical flow diagram illustrating an exemplary methodology 700 for writing one or more magnetic memory cells, in accordance with one aspect of the invention. In step 702, addresses and data for n magnetic memory cells that are to be written are input. In step 704, the stored data is read and compared to the input data. Magnetic memory cells that require toggling are then selected. In step 706, those selected magnetic memory cells that require toggling are toggled, for example using a write field $h_{box} < 1.14$.

In step 708, the data stored in the magnetic memory cells are checked again. Namely, for at least those magnetic memory cells toggled in step 706, the stored data is read and compared to the input data. Any of the magnetic memory cells toggled in step 706 that are in error are selected for toggling a second time. The subset of memory cells selected for toggling again will generally be substantially smaller than the set of memory cells selected in step 706.

In step 710, the process loops back to the toggling step, e.g., step 706, if any magnetic memory cells remain that are in error. The process is continued until all cells are written correctly.

Typically, in step 706 about 50 percent of the magnetic memory cells are written. However, only a small fraction of the magnetic memory cells, e.g., about 0.5P, will need to be rewritten. Further, only about $0.5P^2$ of the magnetic memory cells will need to be rewritten a second time. Therefore, in general, on the $j^{th}$ pass, only a fraction about $0.5P^{j-1}$ of the magnetic memory cells will need to be written. Since P<<1, in a few iterations of the process all of the magnetic memory cells selected for toggling will be correctly written.

According to the exemplary methodology illustrated in FIG. 7, the write time will be variable. Namely, in some instances all the magnetic memory cells may be written correctly on the first pass through the loop, whereas in other cases, five or six passes through the loop may be required, resulting in a longer write time.

Error correction code (ECC) may be employed in the present techniques to attain a predictable write time, as will be described in detail below, for example, in conjunction with the description of FIG. 8. With ECC, data is stored along with two or more extra bits of data that are used to correct detected errors. For example, the use of six ECC bits for every 64 bits of data allow for the correction of single bit errors and the detection of double bit errors. Error correction and detection methodologies are known by those skilled in the art. However, while ECC can be employed to correct one error in the 64+six bits, by design ECC cannot correct two or more errors. Therefore, as will be described in detail below, ECC can be combined with the present techniques in a way that intentionally allows one write error to go by uncorrected, and only rewrites data if there are two or more write errors present.

With toggle magnetic memory cells, soft errors only affect the magnetic memory cells being toggle written. Magnetic memory cells that are not selected or that are only half selected have no significant probability of being upset by soft errors (e.g., have no SER). Therefore, errors are only produced during the write operation of the magnetic memory cells toggled.

According to the present techniques employing ECC, if one error is produced during the write operation, that error can be left uncorrected because it will be detected and corrected when the data is read out using the ECC. Thus, only if there are two or more errors, will they need to be corrected during the write operation, such as by using the exemplary methodology described above in connection with FIG. 7.

Further, in an exemplary embodiment, P is chosen to be small enough, such that the probability of having three or more errors is negligibly small, e.g., less than about 0.1 failures over a ten year period for, e.g., an exemplary 16 megabit memory, and thus essentially never encountered in practice. In this way, at most one or two errors are ever preferably encountered, and the system only has to loop back to rewrite magnetic memory cells at most once, thereby providing a well defined upper limit on the write time.

Figure 8:
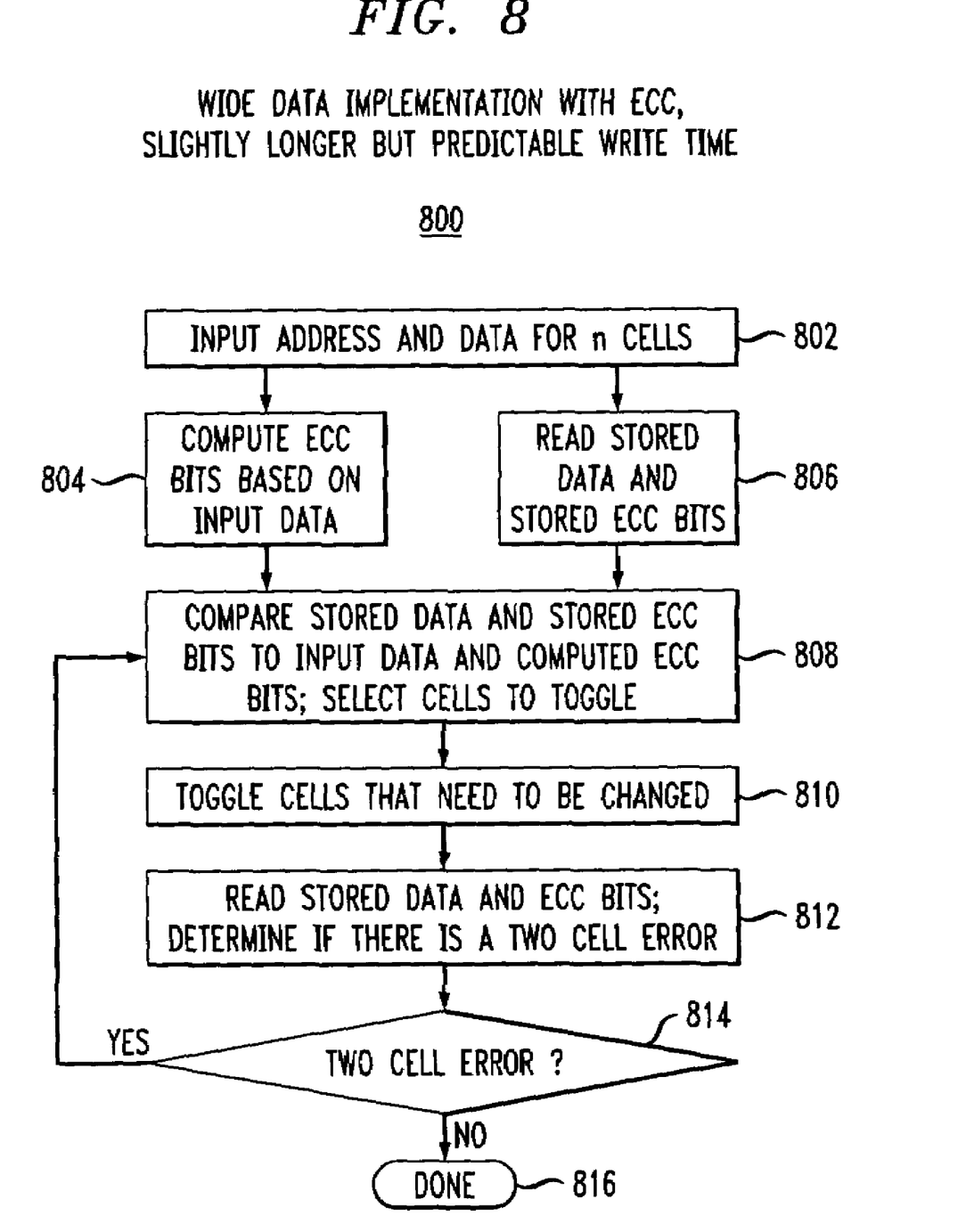
FIG. 8 is a logical flow diagram illustrating an exemplary methodology for writing one or more memory cells using error correction code according to an embodiment of the present invention.

FIG. 8 is a logical flow diagram illustrating an exemplary methodology 800 for writing one or more memory cells using ECC. In step 802, the addresses and data for the n memory cells, e.g., magnetic memory cells, that are to be written are input. Based on this data, the ECC bits are computed, as in step 804, while at the same time the stored data and stored ECC bits are read in, as in step 806. In step 808, the stored data and ECC bits are compared to the input data to determine which magnetic memory cells need to be toggled. In step 810, those magnetic memory cells that need to be written are toggled. In step 812, the data and ECC bits are read, and the ECC is used to determine if there are two or more errors present in the written data. In step 814, if there are no errors, or if there is at most a single error, then the write operation is finished (the one error being correctable using the ECC during a read operation), as in step 816. If there are two or more errors, then the system loops back, e.g., to step 808, to compare the data again and determine which magnetic memory cells to re-toggle (e.g., rewrite), as previously explained.

This loop continues until there is at most one error (the write probabilities are such that there is a vanishingly small probability more than one additional loop will be required), as is described in detail below. Therefore, there is a definite predictable maximum write cycle time associated with the exemplary methodology 800.

For example, if the write field is chosen to be 75 percent of $h_{box}=1.14$, then it may be determined from the exemplary graph shown in FIG. 6, that the probability of failing is about $P=3 \times 10^{-8}$. Therefore, given an exemplary 64 bit word, the chance of there being two errors, which will need to be corrected, is roughly $2 \times 10^{-12}$. However, the probability for there being three or more errors is less than $2 \times 10^{-18}$, which is unlikely to occur during the lifetime of typical data storage devices. Further, the probability of there being two successive write cycles with two write errors is roughly $2 \times 10^{-27}$, which is also unlikely to occur during the lifetime of typical data storage devices.

Figure 9:
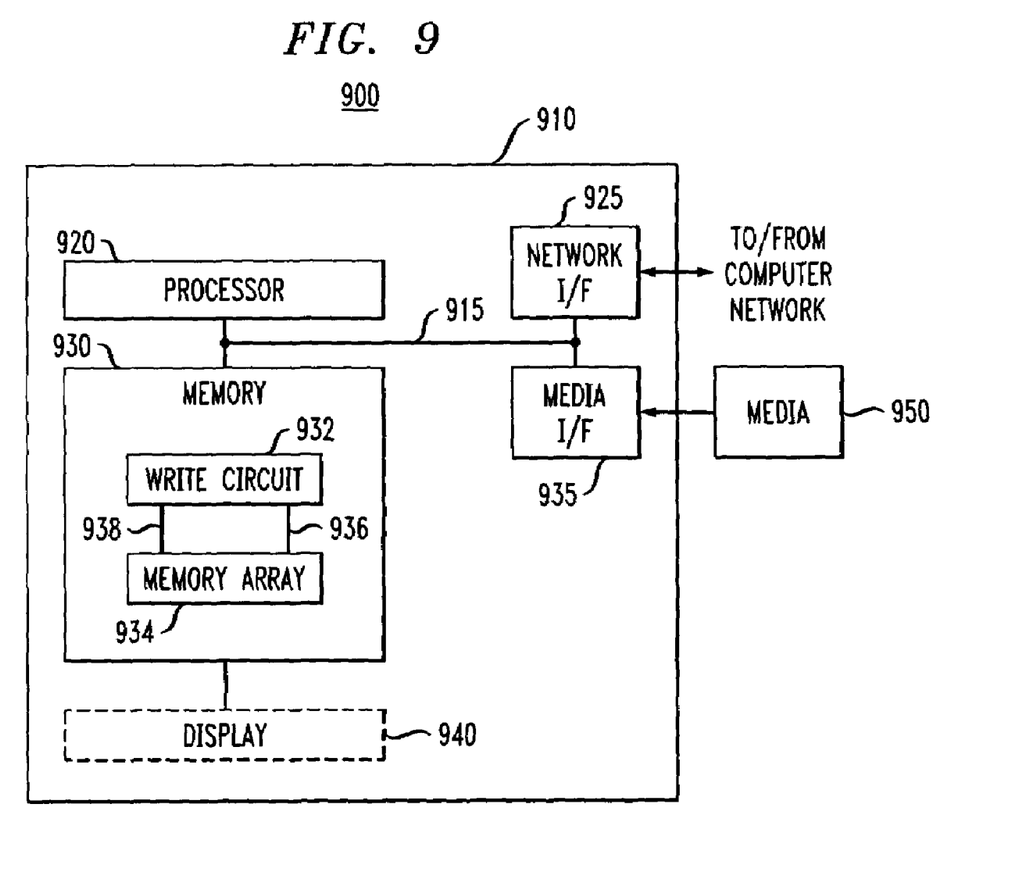
FIG. 9 is a diagram illustrating an exemplary system for implementing one or more of the present techniques according to an embodiment of the present invention.

FIG. 9 is a block diagram of an exemplary hardware implementation of one or more of the methodologies of the present invention. Apparatus 900 comprises a computer system 910 that interacts with media 950. Computer system 910 comprises a processor 920, a network interface 925, a memory 930, a media interface 935 and an optional display 940, connected together, for example, via a bus 915. Network interface 925 allows computer system 910 to connect to a network, while media interface 935 allows computer system 910 to interact with media 950, such as, but not limited to, a Digital Versatile Disk (DVD) or a hard drive.

As is known in the art, the methods and apparatus discussed herein may be distributed as an article of manufacture that itself comprises a computer-readable medium having computer-readable code means embodied thereon. The computer-readable program code means is operable, in conjunction with a computer system such as computer system 910, to carry out all or some of the steps to perform one or more of the methods or create the apparatus discussed herein. For example, the computer-readable code is configured to implement a method for writing one or more magnetic memory cells, by the steps of: writing data to one or more of the magnetic memory cells; detecting whether there are any errors in the data written to the one or more magnetic memory cells; and rewriting the data to each of the one or more previously written magnetic memory cells in which an error is detected. The computer-readable medium may be a recordable medium (e.g., floppy disks, hard drive, optical disks such as a DVD, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic medium or height variations on the surface of a compact disk.

Memory 930 configures the processor 920 to implement the methods, steps, and functions disclosed herein. The memory 930 could be distributed or local and the processor 920 could be distributed or singular. The memory 930 could be implemented as an electrical, magnetic or optical memory, or any combination of these or other types of storage devices. Moreover, the term "memory" should be construed broadly enough to encompass any information able to be read from or written to an address in the addressable space accessed by processor 920. With this definition, information on a network, accessible through network interface 925, is still within memory 930 because the processor 920 can retrieve the information from the network. It should be noted that each distributed processor that makes up processor 920 generally contains its own addressable memory space. It should also be noted that some or all of computer system 910 can be incorporated into an application-specific or general-use integrated circuit.

In an alternative exemplary embodiment, memory 930 comprises memory array 934 having one or more magnetic memory cells. Memory 930 also comprises a write circuit 932 coupled to memory array 934 by one or more bits lines 938 and word lines 936. Write circuit 932 is adapted to perform one or more of the techniques presented herein.

Optional video display 940 is any type of video display suitable for interacting with a human user of apparatus 900. Generally, video display 940 is a computer monitor or other similar video display.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method for writing one or more magnetic memory cells, the method comprising the steps of:
    writing data and an error correction code to one or more of the magnetic memory cells;
    detecting whether there are any errors in the data written to the one or more magnetic memory cells that said error correction code cannot correct, wherein said detection step is performed substantially upon completion of said writing step; and
    rewriting the data to each of the one or more previously written magnetic memory cells in which said error is detected; and
wherein said error is due to an incorrect orientation of a magnetization of the one or more magnetic memory cells.

2. The method of claim 1, wherein at least one of the one or more magnetic memory cells comprises a flee layer having at least two magnetic layers anti-parallel coupled by at least one spacer layer.

3. The method of claim 1, wherein at least one of the one or more magnetic memory cells is configured to have a substantially predictable soft error rate during writing.

4. The method of claim 1, further comprising the step of repeating the steps of detecting and rewriting until at most one error is detected.

5. The method of claim 1, further comprising the step of repeating the steps of detecting and rewriting until no errors are detected.

6. The method of claim 1, wherein a probability that an error will occur in any one of the one or more magnetic memory cells is substantially equivalent to $$1 - \exp\left[-\frac{t}{\tau} e^{-E_a/kT}\right],$$

wherein $\tau$ is the attempt period, t is the length of time the magnetic memory cell has activation energy $E_a$, k is Boltzmann's constant and T is absolute temperature.

7. The method of claim 3, wherein the substantially predictable soft error rate of the one or more magnetic memory cells is less than or equal to about three percent.

8. The method of claim 1, wherein the steps of detecting and rewriting are repeated less than or equal to ten times.

9. The method of claim 1, wherein the errors are detected by comparing the data written to the one or more magnetic memory cells with input data.

10. The method of claim 1, comprising a variable write time

11. The method of claim 1, wherein the step of detecting further comprises the step of using error correction code to detect errors.

12. The method of claim 11, wherein the step of rewriting the data to the magnetic memory cells is performed when a number of errors is greater than or equal to two.

13. A method for writing one or more memory cells, the method comprising the steps of:
writing data and an error correction code to one or more of the memory cells;
detecting whether there are any errors in the data written to the one or more memory cells that said error correction code cannot correct by using said error correction code, wherein said detection step is performed substantially upon completion of said writing step; and
rewriting the data to each of the one or more previously written memory cells in which an error is detected when a number of errors detected is greater than or equal to two, wherein said error is due to an incorrect orientation of a magnetization of the one or more magnetic memory cells.

14. An apparatus for writing one or more magnetic memory cells, the apparatus comprising:
a memory; and
at least one processor, coupled to the memory, operative to:
write data and an error correction code to one or more of the magnetic memory cells;
detect whether there are any errors in the data written to the one or more magnetic memory cells that said error correction code cannot correct, wherein said detection is performed substantially upon completion of said writing step; and
rewrite the data to each of the one or more previously written magnetic memory cells in which an error is detected, wherein said error is due to an incorrect orientation of a magnetization of the one or more magnetic memory cells.

15. An article of manufacture for writing one or more magnetic memory cells, comprising a machine readable medium containing one or more programs which when executed implement the steps of:
writing data and an error correction code to one or more of the magnetic memory cells;
detecting whether there are any errors in the data written to the one or more magnetic memory cells that said error correction code cannot correct, wherein said detection step is performed substantially upon completion of said writing step; and
rewriting the data to each of the one or more previously written magnetic memory cells in which an error is detected, wherein said error is due to an incorrect orientation of a magnetization of the one or more magnetic memory cells.

16. An integrated circuit including at least one magnetic random access memory circuit, the at least one random access memory circuit comprising:
a plurality of magnetic memory cells;
a plurality of bit lines and word lines for selectively accessing one or more of the memory cells; and
a write circuit coupled to at least a portion of the bit lines and word lines, the write circuit being adapted to:
write data and an error correction code to one or more of the magnetic memory cells;
detect whether there are any errors in the data written to the one or more magnetic memory cells that said error correction code cannot correct, wherein said detection is performed substantially upon completion of said writing step; and
rewrite the data to each of the one or more previously written magnetic memory cells in which an error is detected, wherein said error is due to an incorrect orientation of a magnetization of the one or more magnetic memory cells.

* * * * *